(12) United States Patent
Enders et al.

(10) Patent No.: US 7,081,392 B2
(45) Date of Patent: Jul. 25, 2006

(54) METHOD FOR FABRICATING A GATE STRUCTURE OF A FET AND GATE STRUCTURE OF A FET

(75) Inventors: Gerhard Enders, Olching (DE); Peter Voigt, Hallbergmoos (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/897,403

(22) Filed: Jul. 23, 2004

(65) Prior Publication Data

US 2005/0085043 A1 Apr. 21, 2005

(30) Foreign Application Priority Data

Jul. 24, 2003 (DE) ................ 103 33 776

(51) Int. Cl.
*H01L 21/336* (2006.01)
(52) U.S. Cl. .............. 438/289; 438/306; 438/524
(58) Field of Classification Search ............ None
See application file for complete search history.

(56) References Cited

U.S. PATENT DOCUMENTS

| | | | |
|---|---|---|---|
| 5,750,430 A | 5/1998 | Son | |
| 5,899,719 A | 5/1999 | Hong | |
| 6,025,232 A * | 2/2000 | Wu et al. | 438/270 |
| 6,544,851 B1 | 4/2003 | Ponomarev et al. | |
| 6,642,581 B1 * | 11/2003 | Matsuda et al. | 257/369 |

OTHER PUBLICATIONS

D. Widmann et al., "Technologie Hochintegrierter Schaltungen," p. 282, Springer, 2. Auglage, 1996.

* cited by examiner

*Primary Examiner*—Chandra Chaudhari
(74) *Attorney, Agent, or Firm*—Morrison & Foerster LLP

(57) ABSTRACT

A method for fabricating a gate structure of a FET, having: (a) deposition and patterning of a sacrificial layer sequence on a semiconductor substrate and uncovering of a gate section; (b) implantation of a channel doping into the gate section; (c) deposition and patterning of spacers at the sidewalls of the sacrificial layer sequence with the formation of a gate section that is not covered by the spacers; (d) introduction of a mask material into the gate section that is not covered by the spacers; (e) removal of the spacers selectively with respect to the sacrificial layer sequence and mask material); (f) implantation of a halo doping in regions uncovered by the removed spacers; (g) removal of the mask material; (h) formation of a gate on the gate section; and (j) removal of the sacrificial layer sequence selectively with respect to the gate.

10 Claims, 4 Drawing Sheets

METHOD FOR FABRICATING A GATE STRUCTURE OF A FET AND GATE STRUCTURE OF A FET

CLAIM FOR PRIORITY

This application claims the benefit of priority to German Application No. 103 33 776.8, filed on Jul. 24, 2003, the contents of which are hereby incorporated by reference.

TECHNICAL FIELD OF THE INVENTION

The present invention relates to a method for fabricating a gate structure of a FET and to a gate structure of a FET, and in particular, to a method for fabricating a MOS gate structure of a transistor.

BACKGROUND OF THE INVENTION

In MOS transistors, the progressive miniaturization is accompanied by correspondingly short gate channel lengths of the field-effect transistors. With the aid of a so-called halo implantation, in new process generations of MOSFETs, it is generally attempted to enable a relatively stable threshold voltage of the transistor despite the short gate channel lengths. However the transistor threshold voltage nevertheless falls sharply in the case of channel lengths in the range of between approximately 50 nm and 100 nm.

In technological terms, a halo implantation is currently a doping dose which is implanted under the gate after the gate patterning at a largest possible angle and increases the channel doping of the gate channel directly adjoining the source and drain regions of the FET. This effectively means that a higher channel doping is effective in the case of transistors having a short channel length than in the case of longer transistors. This counteracts the sharp fall in the transistor threshold voltage, the so-called "roll-off effect", which occurs in the case of transistors without a halo implantation. This means that the threshold voltage in the case of short transistors with a halo implantation decreases continuously, and not abruptly.

One disadvantage of a customary halo implantation consists in the restriction of the implantation angle, which is determined by the distance between adjacent gate structures and the height of the gate structures. Moreover, the halo implantation is also effected into the entire source/drain region, as a result of which a parasitic junction capacity is undesirably increased significantly. What is more, there is currently no possibility technologically for spatially delimiting the doping, produced by the halo implantation, only closely beneath the gate oxide. In the case of known methods for fabricating short gate channels, the halo doping is implanted after the gate patterning. The disadvantages described above cannot be avoided in this way.

SUMMARY OF THE INVENTION

The present invention provides a method for fabricating a gate structure of a FET and a gate structure of a FET by means of which the disadvantages explained above are avoided.

In one embodiment of the present invention, a Damascene technique is used during the gate patterning, in which case, before the deposition of the gate material, with the aid of a spacer technique, a narrow region of the gate channel region along the gate edge is uncovered, into which the halo doping is implanted. The halo doping is thus introduced into sections in which it is necessary and is required for a high performance of the transistor.

The halo doping is consequently implanted in a targeted manner into the transistor channel sections in which it has to be positioned for an optimum transistor performance. The halo doping is implanted before the deposition of the gate material, with the aid of a self-aligning technology, into the regions below the gate along the gate edge.

In another embodiment of the present invention, there is a method for fabricating a gate structure of a FET, having: (a) deposition and patterning of a sacrificial layer sequence on a semiconductor substrate and uncovering of a gate section; (b) implantation of a channel doping into the gate section; (c) deposition and patterning of spacers at sidewalls of the sacrificial layer sequence with the formation of a gate section that is not covered by the spacers; (d) introduction of a mask material into the gate section that is not covered by the spacers; (e) removal of the spacers selectively with respect to the sacrificial layer sequence and mask material; (f) implantation of a halo doping in regions uncovered by the removed spacers; (g) removal of the mask material; (h) deposition of a gate on the gate section; and (i) removal of the sacrificial layer sequence selectively with respect to the gate.

In accordance with one preferred embodiment, a sacrificial oxide, polysilicon and/or silicon nitride $Si_3N_4$ is applied as the sacrificial layer sequence.

In accordance with a further preferred embodiment, for the deposition and patterning of the spacers, a layer, preferably made of polysilicon, is deposited conformally, which layer is etched back anisotropically selectively with respect to an oxide and silicon nitride.

In accordance with a further preferred embodiment, for the introduction of the mask material, the mask material is deposited and then etched back or planarized by means of a CMP process.

In accordance with a further preferred emboidment, the mask material, preferably an organic material, is etched selectively with respect to the oxide and polysilicon and serves as an etching mask during an etching of the polysilicon.

In accordance with a further preferred embodiment, before the deposition of the gate material, a gate oxide is grown in the gate region uncovered by the spacers and the mask material.

In accordance with a further preferred embodiment, before the growth of a gate oxide, a screen oxide is removed in the gate section.

In accordance with a further preferred embodiment, polysilicon or TiN/W is deposited as the gate material.

In accordance with a further preferred embodiment, after the deposition of the gate material a planarization step is carried out.

BRIEF DESCRIPTION OF THE DRAWINGS

Exemplary embodiments of the invention are illustrated in the drawings and explained in more detail in the description below.

In the figures.

In the figures, identical reference symbols designate identical or functionally identical component parts.

DETAILED DESCRIPTION OF THE INVENTION

Figure 1:
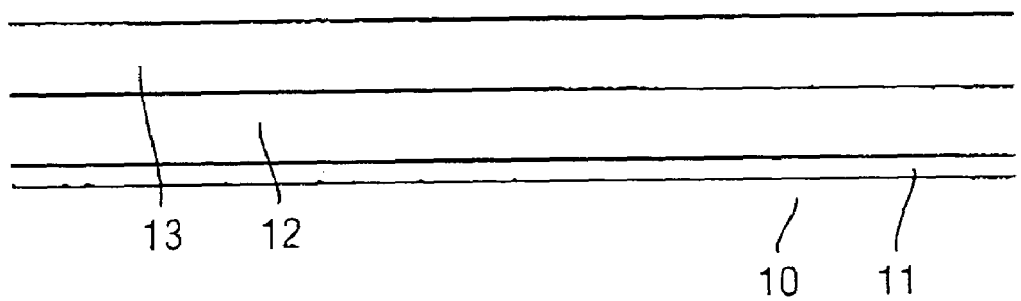
FIGS. 1 to 11 show individual steps for fabricating a gate structure in accordance with an embodiment of the present invention.

FIG. 1 illustrates a semiconductor substrate 10, on which a sacrificial layer sequence 11, 12, 13 has been applied. The sacrificial layer sequence 11, 12, 13 preferably has a sacrificial oxide 11, a polysilicon layer 12 and a nitride layer 13, in particular silicon nitride $Si_3N_4$.

Figure 2:
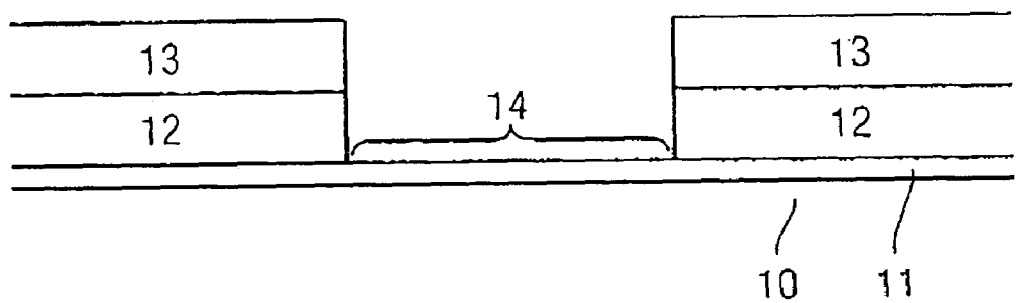

In accordance with FIG. 2, the polysilicon layer 12 and the silicon nitride layer 13 of the sacrificial layer sequence 11, 12, 13 in accordance with FIG. 1 have been patterned. This is preferably effected in an etching process with the uncovering of a gate region 14.

Figure 3:
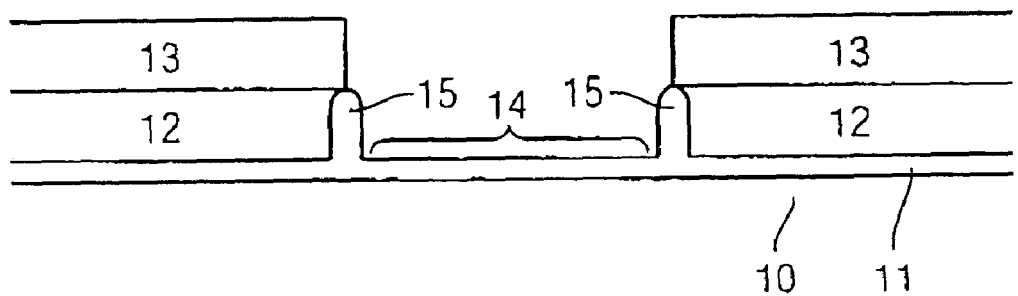

In accordance with FIG. 3, an oxidation ensues, during which a sidewall oxide 15 of the polysilicon layer 12 of the sacrificial layer sequence 11, 12, 13 is formed.

Figure 4:
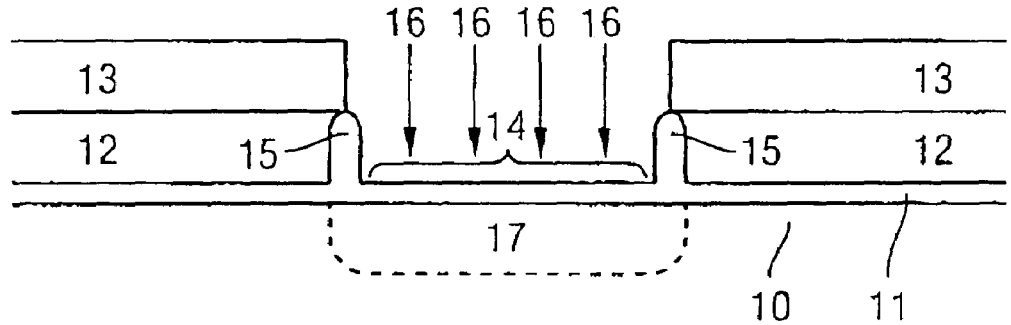

FIG. 4 illustrates the implantation 16 of a channel doping 17 in the gate region 14 of the semiconductor substrate 10.

Figure 5:
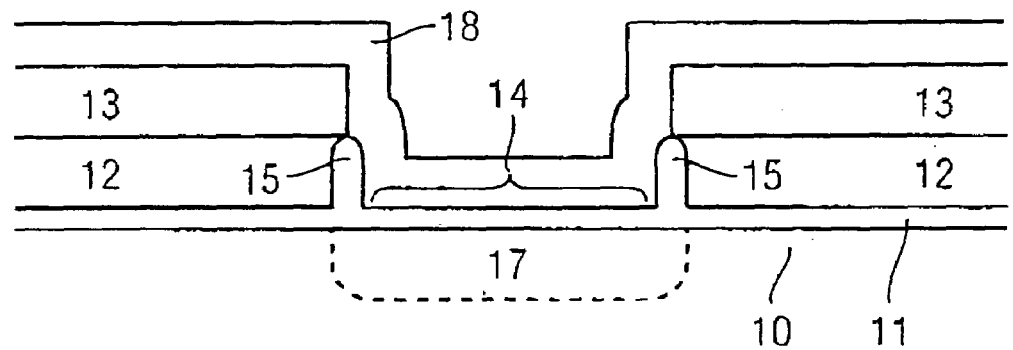
Figure 6:
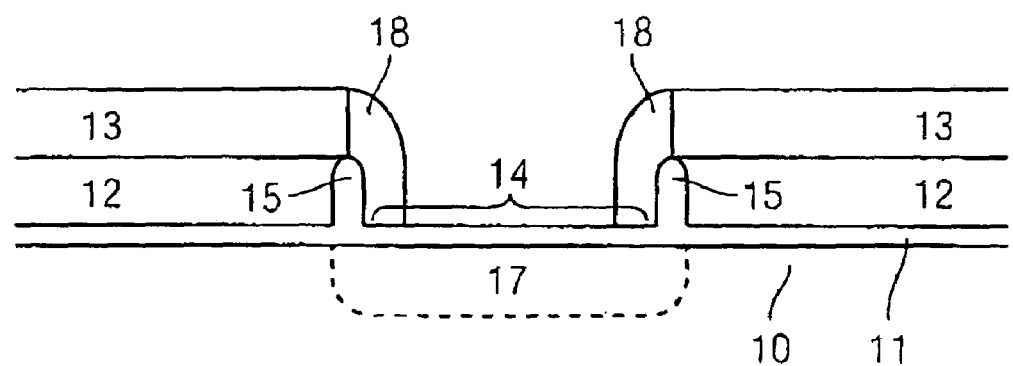

In a subsequent step, as illustrated in FIG. 5, a layer 18, preferably made of polysilicon, is deposited conformally. This layer 18 is anisotropically etched back selectively with respect to the sacrificial oxide 11 and the nitride 13 in accordance with FIG. 6. The resulting spacers 18 bear on the sidewall and thus also on the sidewall oxide 15 of the sacrificial layer sequence 12, 13.

Figure 7:
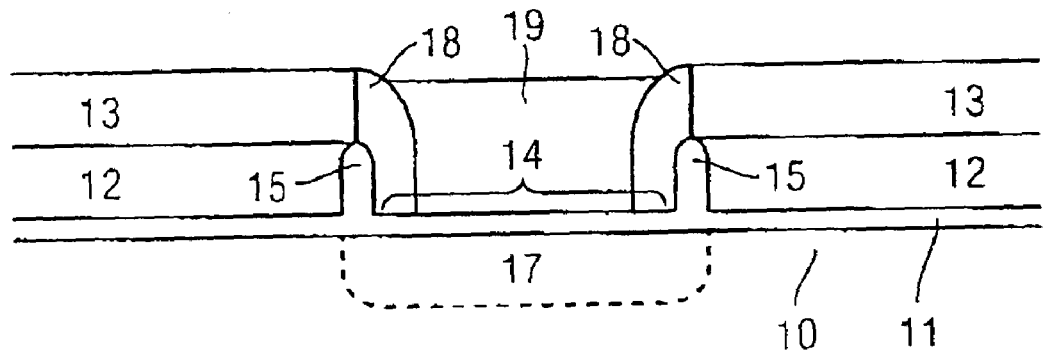

In accordance with FIG. 7 the remaining section of the gate region 14 is filled with a mask material 19, which can be etched selectively both with respect to an oxide 11, 15 and with respect to polysilicon 18. An organic material is preferably suitable for the mask material 19, the material serving as an etching mask during a polysilicon etching. After the deposition of the mask material 19, the mask material is etched back or planarized with the aid of a CMP step, so that the mask material 19 remains directly above the gate region 14.

Figure 8:
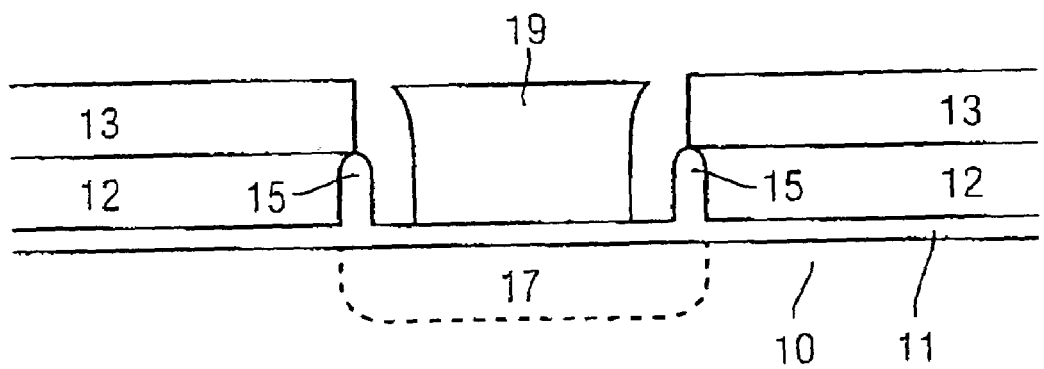

FIG. 8 illustrates the arrangement in accordance with FIG. 7 after the removal of the spacers 18. For this purpose, the polysilicon spacers 18 are etched selectively with respect to oxide 11, 15 and the, preferably organic, material 19 lying in the center of the gate channel region 14.

Figure 9:
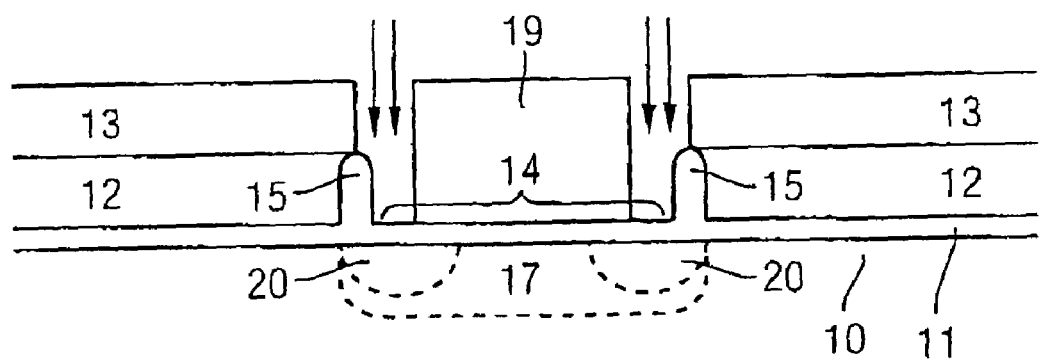

In the sections that are etched free in accordance with FIG. 8, a halo doping 20 is implanted along the sacrificial layer sequence 12, 13 in accordance with FIG. 9, preferably in a direction perpendicular to the surface of the semiconductor substrate 10, with a predetermined dopant concentration. In this way, halo doping sections 20 form in the outer sections of the gate region 14 in a manner adjoining the sidewall oxide 15, and have a higher dopant concentration, i.e. in particular ion concentration, than the channel doping 17.

Figure 10:
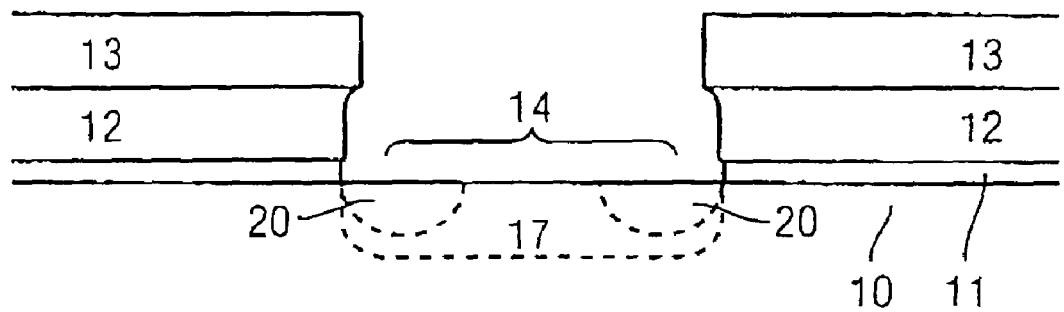

In the process step in accordance with FIG. 10, the mask material 19 has been removed. In addition, the sidewall oxide 15 and the sacrificial oxide layer 11 above the semiconductor substrate 10 in the gate region 14 are likewise removed. In a subsequent process step, in accordance with FIG. 11, firstly in an oxidation a gate oxide 11' is produced in the gate region 14 and a new sidewall oxide 15' is produced on the polysilicon layer 12 of the sacrificial layer sequence 11, 12, 13. Moreover, a gate material 21 has been deposited in accordance with FIG. 11. If necessary, a planarization step is carried out following the deposition of the gate material 21, preferably polysilicon or TiN/W.

Figure 11:
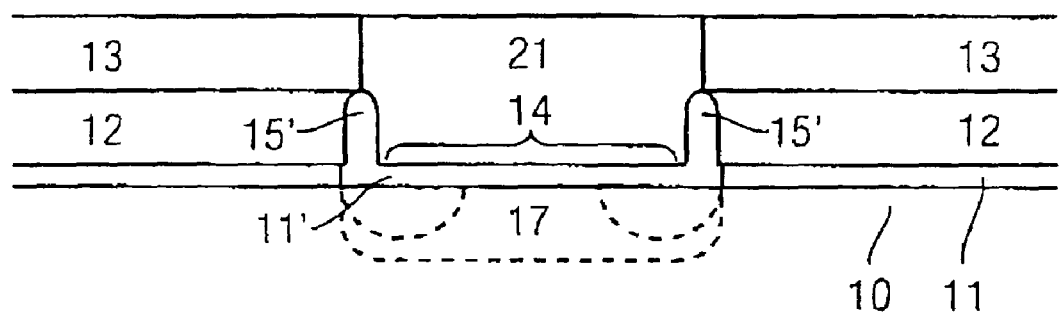
Figure 12:
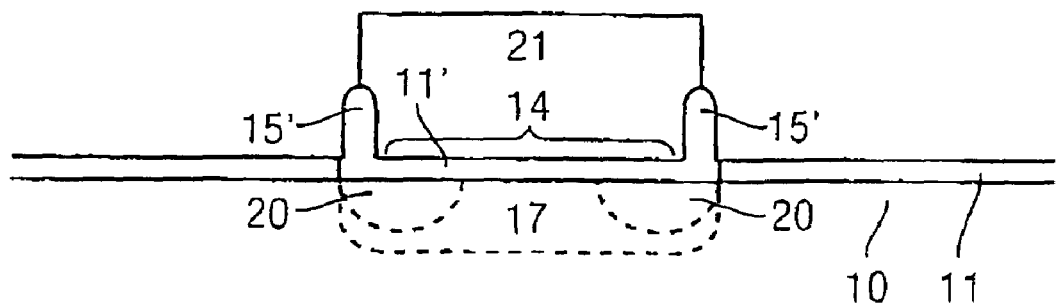
FIG. 12 shows a gate structure of a FET which has been fabricated in accordance with an embodiment of the present invention.

In the finished gate structure in accordance with FIG. 12, in comparison with FIG. 11, the negative sacrificial gate structure 12, 13 has been removed selectively with respect to the gate 21 and with respect to the underlying oxide 11', 15'. Consequently, the method according to the invention provides a gate 21 with a sidewall oxide 15' at least in a predetermined height corresponding to the height of the polysilicon layer 12 of the sacrificial layer sequence 11, 12, 13, the halo doping 20 preferably not extending beyond the region of the channel doping 17. The halo doping sections 20 preferably lie completely under the actual gate 21 and, consequently, do not reach into the region of subsequent dopings such as the doping of source and drain regions (not illustrated) in the semiconductor substrate 10. The further process implementation proceeds as standard with an implantation of a source/drain extension, spacer production, a source/drain implantation and a subsequent wiring.

Although the present invention has been described above with reference to an exemplary embodiment, it is not restricted thereto, but rather can be modified in diverse ways. Thus, the materials of the various layers and depositions are to be regarded as by way of example. What is more, arbitrary intermediate steps can be inserted into the method sequence.

LIST OF REFERENCE SYMBOLS

10 Semiconductor
11 Sacrificial oxide
11' Gate oxide
12 Polysilicon
13 Nitride, preferably silicon nitride
14 Gate oxide
15 Sidewall oxide
15' Sidewall oxide, preferably grown with gate oxide
16 Channel implantation
17 Channel doping
18 Conformally deposited layer, preferably made of poly-Si
19 Mask material, preferably etchable selectively with respect to poly-Si and oxide
20 Halo doping
21 Gate

What is claimed is:

1. A method for fabricating a gate structure of a FET, comprising:
   depositing and patterning of sacrificial layer sequence on a semiconductor substrate and uncovering of a gate section;
   implanting a channel doping into the gate section;
   depositing and patterning of spacers at sidewalls of the sacrificial layer sequence with the formation of a gate section that is not covered by the spacers;
   introducing of a mask material into the gate section that is not covered by the spacers;
   removing the spacers selectively with respect to the sacrificial layer sequence and mask material;
   implanting a halo doping in regions uncovered by the removed spacers;
   removing the mask material;
   forming a gate on the gate section; and
   removing the sacrificial layer sequence selectively with respect to the gate.

2. The method according to claim 1, wherein the sacrificial layer is taken from a group consisting of a sacrificial oxide, polysilicon and silicon nitride $Si_3N_4$.

3. The method according to claim 1, wherein an oxide is formed at least on sidewall sections of the sacrificial layer sequence.

4. The method according to claim 1, wherein, for the deposition and patterning of the spacers, a layer is deposited conformally, which layer is etched back anisotropically selectively nitride.

5. The method according to claim 1, wherein, for the introduction of the mask material, the mask material is deposited and subsequently etched back or planarized by means of a CMP process.

6. The method according to claim 1, wherein the mask material is etched selectively and serves as an etching mask during an etching of the polysilicon.

7. The method according to claim 1, wherein, before the deposition of the gate material, a gate oxide is grown in the gate region uncovered by the spacers and the mask material.

8. The method according to claim 1, wherein, before the growth of a gate oxide, a sacrificial oxide is removed in the gate section.

9. The method according to claim 1, wherein polysilicon or TiN/W is deposited as the gate material.

10. The method according to claim 1, wherein, after the deposition of the gate a planarization step is carried out.

* * * * *